US012281951B2

(12) United States Patent
Veillette et al.

(10) Patent No.: US 12,281,951 B2
(45) Date of Patent: *Apr. 22, 2025

(54) MAGNETOELASTIC TORQUE SENSOR WITH LOCAL MEASUREMENT OF AMBIENT MAGNETIC FIELD

(71) Applicant: BRP Megatech Industries Inc., Valcourt (CA)

(72) Inventors: Jean-Francois Veillette, St. Boniface (CA); Serge Kaldany, Munich (DE)

(73) Assignee: BRP Megatech Industries Inc., Valcourt (CA)

( * ) Notice: Subject to any disclaimer, the term of this patent is extended or adjusted under 35 U.S.C. 154(b) by 322 days.

This patent is subject to a terminal disclaimer.

(21) Appl. No.: 17/929,022

(22) PCT Filed: Feb. 11, 2020

(86) PCT No.: PCT/IB2020/051099
§ 371 (c)(1),
(2) Date: Aug. 10, 2022

(87) PCT Pub. No.: WO2021/161066
PCT Pub. Date: Aug. 19, 2021

(65) Prior Publication Data
US 2023/0114412 A1     Apr. 13, 2023

(51) Int. Cl.
*G01L 3/00* (2006.01)
*G01L 3/10* (2006.01)
(Continued)

(52) U.S. Cl.
CPC .............. *G01L 3/102* (2013.01); *G01L 5/221* (2013.01); *G01R 33/072* (2013.01); *H10N 35/101* (2023.02)

(58) Field of Classification Search
CPC ....... G01L 3/102; G01L 5/221; G01R 33/072; H10N 35/101
See application file for complete search history.

(56) References Cited

U.S. PATENT DOCUMENTS

| 3,263,796 A | 8/1966 | Parke |
| 4,656,750 A | 4/1987 | Pitt et al. |

(Continued)

FOREIGN PATENT DOCUMENTS

| CA | 2073293 C | 11/1996 |
| CN | 2903949 Y | 5/2007 |

(Continued)

OTHER PUBLICATIONS

Banks, Kevin, "The Goertzel Algorithm", Aug. 28, 2002, https://www.embedded.com/design/configurable-systems/4024443/The-Goertzel-Algorithm#, 5 pages.

(Continued)

*Primary Examiner* — Francis C Gray
(74) *Attorney, Agent, or Firm* — BCF LLP

(57) ABSTRACT

A torque sensor including a shaft that receives an applied torque is disclosed. The shaft includes a magnetoelastic region that generates a non-negligible magnetic field responsive to the applied torque and one or more null regions that each generates a negligible magnetic field. The torque sensor includes a plurality of null region sensors proximal a null region that generate a null region magnetic field measure corresponding to a magnitude of an ambient magnetic field. The torque sensor includes a magnetoelastic region sensor proximal the magnetoelastic region that generates a magnetoelastic region magnetic field measure corresponding to the magnitude of the ambient magnetic field and a magnitude of the non-negligible magnetic field. The torque sensor includes a controller coupled to the null region sensors and the magnetoelastic region sensor that calculates a magnitude (Continued)

US 12,281,951 B2

Page 2 of the applied torque based on the null region magnetic field measures and the magnetoelastic region magnetic field measure.

14 Claims, 9 Drawing Sheets

(51) Int. Cl.
  *G01L 5/22* (2006.01)
  *G01R 33/07* (2006.01)
  *H10N 35/00* (2023.01)

(56) References Cited

U.S. PATENT DOCUMENTS

| | | |
|---|---|---|
| 4,760,745 A | 8/1988 | Garshelis |
| 4,882,936 A | 11/1989 | Garshelis |
| 4,896,544 A | 1/1990 | Garshelis |
| 4,989,460 A | 2/1991 | Mizuno et al. |
| 5,052,232 A | 10/1991 | Garshelis |
| 5,307,690 A | 5/1994 | Hanazawa |
| 5,321,985 A | 6/1994 | Kashiwagi et al. |
| 5,351,555 A | 10/1994 | Garshelis |
| 5,419,207 A | 5/1995 | Kobayashi et al. |
| 5,465,627 A | 11/1995 | Garshelis |
| 5,520,059 A | 5/1996 | Garshelis |
| 5,522,269 A | 6/1996 | Takeda et al. |
| 5,526,704 A | 6/1996 | Hoshina et al. |
| 5,562,004 A | 10/1996 | Kaise et al. |
| 5,589,645 A | 12/1996 | Kobayashi et al. |
| 5,591,925 A | 1/1997 | Garshelis |
| 5,706,572 A | 1/1998 | Garshelis |
| 5,708,216 A | 1/1998 | Garshelis |
| 5,887,335 A | 3/1999 | Garshells |
| 5,939,881 A | 8/1999 | Slater et al. |
| 6,047,605 A | 4/2000 | Garshelis |
| 6,145,387 A | 11/2000 | Garshelis |
| 6,222,363 B1 | 4/2001 | Cripe |
| 6,260,423 B1 | 7/2001 | Garshelis |
| 6,278,271 B1 | 8/2001 | Schott |
| 6,341,534 B1 | 1/2002 | Dombrowski |
| 6,490,934 B2 | 12/2002 | Garshelis |
| 6,499,559 B2 | 12/2002 | Mc Cann et al. |
| 6,522,130 B1 | 2/2003 | Lutz |
| 6,553,847 B2 | 4/2003 | Garshelis |
| 6,581,480 B1 | 6/2003 | May et al. |
| 6,768,301 B1 | 7/2004 | Hohe et al. |
| 6,807,871 B1 | 10/2004 | Paek |
| 6,810,754 B2 | 11/2004 | May |
| 6,826,969 B1 | 12/2004 | May |
| 7,117,752 B2 | 10/2006 | May |
| 7,124,649 B2 | 10/2006 | May |
| 7,235,968 B2 | 6/2007 | Popovic et al. |
| 7,263,904 B2 | 9/2007 | Yoshida et al. |
| 7,302,867 B2 | 12/2007 | May |
| 7,305,882 B1 | 12/2007 | May |
| 7,308,835 B2 | 12/2007 | Cripe |
| 7,362,096 B2 | 4/2008 | Oberdier et al. |
| 7,363,827 B2 | 4/2008 | Hedayat et al. |
| 7,389,702 B2 | 6/2008 | Ouyang et al. |
| 7,391,211 B2 | 6/2008 | Cripe |
| 7,409,878 B2 | 8/2008 | Von Beck et al. |
| 7,469,604 B2 | 12/2008 | Hedayat et al. |
| 7,506,554 B2 | 3/2009 | Shimizu et al. |
| 7,845,243 B2 | 12/2010 | Poirier et al. |
| 7,895,906 B2 | 3/2011 | Hedayat et al. |
| 7,932,684 B2 | 4/2011 | O'Day et al. |
| 7,969,148 B2 | 6/2011 | Noguchi et al. |
| 8,001,849 B2 * | 8/2011 | Weng ................ G01L 3/105 |
| | | 73/862.333 |
| 8,001,850 B2 | 8/2011 | Hedayat et al. |
| 8,058,865 B2 | 11/2011 | May |
| 8,087,304 B2 | 1/2012 | Lee |
| 8,181,538 B2 | 5/2012 | Yamamura et al. |
| 8,191,431 B2 | 6/2012 | Hedayat et al. |
| 8,203,334 B2 | 6/2012 | Baller et al. |
| 8,299,782 B2 | 10/2012 | Mizuno et al. |
| 8,316,724 B2 | 11/2012 | Ling et al. |
| 8,373,410 B2 | 2/2013 | Frachon |
| 8,424,393 B1 | 4/2013 | Lee |
| 8,468,898 B2 | 6/2013 | Baller et al. |
| 8,578,794 B2 | 11/2013 | Lee |
| 8,635,917 B2 | 1/2014 | Lee |
| 8,677,835 B2 | 3/2014 | Goto et al. |
| 8,701,503 B2 | 4/2014 | Shimizu et al. |
| 8,707,824 B2 | 4/2014 | Benkert et al. |
| 8,836,458 B2 | 9/2014 | Lee |
| 8,844,379 B2 | 9/2014 | Pietron et al. |
| 8,890,514 B2 | 11/2014 | Masson et al. |
| 8,893,562 B2 | 11/2014 | Barraco et al. |
| 9,024,622 B2 | 5/2015 | Hohe et al. |
| 9,151,686 B2 * | 10/2015 | Barraco ................ G01L 3/102 |
| 9,254,863 B2 | 2/2016 | Kuwahara et al. |
| 9,284,998 B2 | 3/2016 | Gießibl |
| 9,347,845 B2 | 5/2016 | Gießibl |
| 9,494,661 B2 | 11/2016 | Paul et al. |
| 9,575,141 B2 | 2/2017 | Rohrer |
| 9,593,990 B2 | 3/2017 | Duan et al. |
| 9,618,318 B2 | 4/2017 | Schaaf |
| 9,683,906 B2 | 6/2017 | Gießibl |
| 10,151,652 B2 | 12/2018 | Gießibl |
| 10,983,019 B2 | 4/2021 | Panine |
| 2001/0029791 A1 | 10/2001 | Sezaki |
| 2004/0119470 A1 | 6/2004 | Yajima et al. |
| 2005/0204830 A1 | 9/2005 | Kuroda et al. |
| 2005/0204831 A1 | 9/2005 | Mori et al. |
| 2007/0028709 A1 | 2/2007 | Futamura et al. |
| 2007/0034021 A1 | 2/2007 | Cripe |
| 2007/0096724 A1 | 5/2007 | Oberdier et al. |
| 2008/0048179 A1 | 2/2008 | Shin et al. |
| 2008/0221399 A1 | 9/2008 | Zhou et al. |
| 2009/0072818 A1 | 3/2009 | Mizuno et al. |
| 2010/0097059 A1 | 4/2010 | Estrada et al. |
| 2010/0156394 A1 | 6/2010 | Ausserlechner et al. |
| 2010/0328799 A1 | 12/2010 | Braganca et al. |
| 2011/0106557 A1 | 5/2011 | Gazula |
| 2011/0162464 A1 * | 7/2011 | Weng ................ G01L 3/102 |
| | | 73/862.333 |
| 2012/0007597 A1 | 1/2012 | Seeger et al. |
| 2012/0007598 A1 | 1/2012 | Lo et al. |
| 2012/0296577 A1 | 11/2012 | Garshelis et al. |
| 2013/0125669 A1 | 5/2013 | Barraco et al. |
| 2013/0181702 A1 | 7/2013 | May |
| 2013/0218517 A1 | 8/2013 | Ausserlechner |
| 2013/0285651 A1 | 10/2013 | Wan et al. |
| 2014/0195117 A1 | 7/2014 | Kuwahara et al. |
| 2014/0197820 A1 | 7/2014 | Ritter et al. |
| 2014/0197822 A1 | 7/2014 | Ritter et al. |
| 2014/0354270 A1 | 12/2014 | Kawano et al. |
| 2015/0025761 A1 | 1/2015 | Kernebeck |
| 2015/0057885 A1 | 2/2015 | Brady et al. |
| 2015/0230294 A1 | 8/2015 | Tonomura et al. |
| 2015/0253162 A1 | 9/2015 | Kusumi et al. |
| 2015/0274204 A1 | 10/2015 | Shiraishi et al. |
| 2016/0121924 A1 | 5/2016 | Norstad |
| 2016/0238472 A1 | 8/2016 | Gie ibl |
| 2017/0324930 A1 | 11/2017 | Shaya |
| 2017/0356822 A1 | 12/2017 | Gie ibl |
| 2017/0370788 A1 | 12/2017 | Neuschaefer-Rube et al. |
| 2018/0231425 A1 | 8/2018 | Raths Ponce et al. |
| 2019/0178683 A1 | 6/2019 | Tetreault et al. |
| 2020/0088594 A1 * | 3/2020 | Simard ................ G01L 5/13 |
| 2021/0229679 A1 * | 7/2021 | Gießibl ................ B60W 10/119 |
| 2021/0278251 A1 | 9/2021 | Tetreault et al. |
| 2022/0034734 A1 | 2/2022 | Veillette et al. |

FOREIGN PATENT DOCUMENTS

| | | |
|---|---|---|
| CN | 101283236 A | 10/2008 |
| CN | 102365537 A | 2/2012 |
| CN | 102472638 A | 5/2012 |
| CN | 102519633 A | 6/2012 |
| CN | 104204730 A | 12/2014 |

(56) References Cited

FOREIGN PATENT DOCUMENTS

| | | |
|---|---|---|
| CN | 104246440 A | 12/2014 |
| DE | 3206503 C1 | 8/1983 |
| DE | 102010033308 A1 | 2/2012 |
| DE | 102015202240 B3 | 2/2016 |
| EP | 0067974 A2 | 12/1982 |
| EP | 0217640 A2 | 4/1987 |
| EP | 0362890 A2 | 4/1990 |
| EP | 0609463 A1 | 8/1994 |
| EP | 0697602 A2 | 2/1996 |
| EP | 0947846 A2 | 10/1999 |
| EP | 0979988 A1 | 2/2000 |
| EP | 1206707 A1 | 5/2002 |
| EP | 1211494 A1 | 6/2002 |
| EP | 1243905 A1 | 9/2002 |
| EP | 1319934 A2 | 6/2003 |
| EP | 1400795 A1 | 3/2004 |
| EP | 1518131 A1 | 3/2005 |
| EP | 1668378 A1 | 6/2006 |
| EP | 1795864 A1 | 6/2007 |
| EP | 1949057 A2 | 7/2008 |
| EP | 1950545 A2 | 7/2008 |
| EP | 2049901 A2 | 4/2009 |
| EP | 2049910 A2 | 4/2009 |
| EP | 2260278 A2 | 12/2010 |
| EP | 2065691 B1 | 12/2011 |
| EP | 2447690 A2 | 5/2012 |
| EP | 2527857 A2 | 11/2012 |
| EP | 1386127 B1 | 1/2013 |
| EP | 2766740 A1 | 8/2014 |
| EP | 2793009 A1 | 10/2014 |
| EP | 2799327 A1 | 11/2014 |
| EP | 2799827 A1 | 11/2014 |
| EP | 2806283 A2 | 11/2014 |
| EP | 3256828 B1 | 7/2019 |
| IN | 105277303 A | 1/2016 |
| JP | S6141935 A | 2/1986 |
| JP | H0116349 B2 | 3/1989 |
| JP | H01187425 A | 7/1989 |
| JP | H02280023 A | 11/1990 |
| JP | H02280024 A | 11/1990 |
| JP | H041542 A | 1/1992 |
| JP | H04191630 A | 7/1992 |
| JP | H0545240 A | 2/1993 |
| JP | H05066164 A | 3/1993 |
| JP | H05126654 A | 5/1993 |
| JP | 10543040 U | 6/1993 |
| JP | H0540849 U | 6/1993 |
| JP | H0545537 U | 6/1993 |
| JP | H05045538 U | 6/1993 |
| JP | H05231966 A | 9/1993 |
| JP | H05231967 A | 9/1993 |
| JP | H05346360 A | 12/1993 |
| JP | H06014939 U | 2/1994 |
| JP | H0674844 A | 3/1994 |
| JP | H0628673 U | 4/1994 |
| JP | 106047832 U | 6/1994 |
| JP | H06258158 A | 9/1994 |
| JP | H06300647 A | 10/1994 |
| JP | H06323930 A | 11/1994 |
| JP | H072943 U | 1/1995 |
| JP | H0780756 A | 3/1995 |
| JP | H07159258 A | 6/1995 |
| JP | H0743521 U | 8/1995 |
| JP | H085477 A | 1/1996 |
| JP | H08043216 A | 2/1996 |
| JP | H08293634 A | 11/1996 |
| JP | H0985587 A | 3/1997 |
| JP | H0995247 A | 4/1997 |
| JP | H09189624 A | 7/1997 |
| JP | 2001050830 A | 2/2001 |
| JP | 2002333375 A | 11/2002 |
| JP | 2002340701 A | 11/2002 |
| JP | 2003307460 A | 10/2003 |
| JP | 2004053433 A | 2/2004 |
| JP | 2004053434 A | 2/2004 |
| JP | 2004053435 A | 2/2004 |
| JP | 2004225096 A | 8/2004 |
| JP | 2004264188 A | 9/2004 |
| JP | 2005321272 A | 11/2005 |
| JP | 2006010669 A | 1/2006 |
| JP | 2006126130 A | 5/2006 |
| JP | 2007101427 A | 4/2007 |
| JP | 2007181327 A | 7/2007 |
| JP | 2008026160 A | 2/2008 |
| JP | 2009122042 A | 6/2009 |
| JP | 2013053954 A | 3/2013 |
| JP | 2013053957 A | 3/2013 |
| JP | 2015009602 A | 1/2015 |
| JP | 2015010870 A | 1/2015 |
| JP | 6071460 B2 | 2/2017 |
| KR | 20050075880 A | 7/2005 |
| KR | 20050093025 A | 9/2005 |
| KR | 20060054775 A | 5/2006 |
| KR | 20070004377 A | 1/2007 |
| WO | 9533982 A1 | 12/1995 |
| WO | 200118556 A1 | 3/2001 |
| WO | 200192906 A2 | 12/2001 |
| WO | 2003006922 A1 | 1/2003 |
| WO | 03071232 A1 | 8/2003 |
| WO | 200405873 A1 | 1/2004 |
| WO | 2004003585 A1 | 1/2004 |
| WO | 2005029106 A1 | 3/2005 |
| WO | 200554803 A1 | 6/2005 |
| WO | 2006115129 A1 | 11/2006 |
| WO | 2007092402 A2 | 8/2007 |
| WO | 2007102465 A1 | 9/2007 |
| WO | 2008017348 A2 | 2/2008 |
| WO | 2011119317 A1 | 9/2011 |
| WO | 2012016664 A2 | 2/2012 |
| WO | 2013053534 A1 | 4/2013 |
| WO | 2016127988 A1 | 8/2016 |
| WO | 2017199063 A1 | 11/2017 |
| WO | 2017214361 A1 | 12/2017 |
| WO | 2018109674 A1 | 6/2018 |

OTHER PUBLICATIONS

Chinese Search Report for CN 201680085804.3, dated Jan. 6, 2020, 1 page.
Chinese Search Report for CN 201780076546.7 dated Jul. 1, 2020, 2 pages.
Chinese Search Report for CN 201780076546.7 dated Mar. 1, 2021, 2 pages.
Computer-Assisted English language abstract for EP2806283A2 extracted from espacenet.com database on Jan. 7, 2019, 4 pages.
Computer-generated English language abstract for DE 10 2010 033 308 A1 extracted from espacenet.com database on Apr. 25, 2021, 2 pages.
Computer-generated English language abstract for DE 10 2015 202 240 B3 extracted from espacenet.com database on Jul. 29, 2020, 2 pages.
Computer-generated English language translation for JPH0540849U extracted from espacenet.com database on Aug. 1, 2019, 7 pages.
Computer-generated English language translation for JPH0543040U extracted from espacenet.com database on Aug. 1, 2019, 6 pages.
Computer-generated English language translation for JPH0545537U extracted from espacenet.com database on Aug. 1, 2019, 9 pages.
Computer-generated English language translation for JPH0545538U extracted from espacenet.com database on Aug. 1, 2019, 8 pages.
Computer-generated English language translation for JPH0614939U extracted from espacenet.com database on Aug. 1, 2019, 10 pages.
Computer-generated English language translation for JPH0628673U extracted from espacenet.com database on Aug. 1, 2019, 6 pages.
Computer-generated English language translation for JPH0647832U extracted from espacenet.com database on Aug. 1, 2019, 9 pages.
Computer-generated English language translation for JPH072943U extracted from espacenet.com database on Aug. 1, 2019, 8 pages.
Computer-generated English language translation for JPH0743521U extracted from espacenet.com database on Aug. 1, 2019, 8 pages.

(56) References Cited

OTHER PUBLICATIONS

Computer-generated English language translation for KR20050075880A extracted from espacenet.com database on Aug. 1, 2019, 4 pages.
Computer-generated English language translation for KR20050093025A extracted from espacenet.com database on Aug. 1, 2019, 4 pages.
Computer-generated English language translation for KR20060054775A extracted from espacenet.com database on Aug. 1, 2019, 4 pages.
English language abstract for CN 101283236 A extracted from espacenet.com database on Jun. 2, 2021, 1 page.
English language abstract for CN 102365537 A extracted from espacenet.com database on Nov. 3, 2021, 1 page.
English language abstract for CN 102472638 A extracted from espacenet.com database on Jun. 2, 2021, 2 pages.
English language abstract for CN 102519633 A extracted from espacenet.com database on Apr. 25, 2021, 1 page.
English language abstract for CN 104204730 A extracted from espacenet.com database on Jun. 2, 2021, 1 page.
English language abstract for CN 104246440 A extracted from espacenet.com database on Jun. 2, 2021, 1 page.
English language abstract for CN 105277303 A extracted from espacenet.com database on Apr. 25, 2021, 1 page.
English language abstract for CN2903949Y extracted from espacenet.com database on Aug. 1, 2019, 1 page.
English language abstract for DE3206503C1 extracted from espacenet.com database on Aug. 1, 2019, 1 page.
English language abstract for EP 0979 988 A1 extracted from espacenet.com database on Jul. 11, 2022, 1 page.
English language abstract for EP1243905A1 extracted from espacenet.com database on Jul. 17, 2019, 1 page.
English language abstract for EP0947846A2 extracted from espacenet.com database on Jan. 7, 2019, 1 page.
English language abstract for EP1243905A1 extracted from espacenet.com database on Aug. 1, 2019, 1 page.
English language abstract for EP1319934A2 extracted from espacenet.com database on Aug. 1, 2019, 2 pages.
English language abstract for EP3256828B1 extracted from espacenet.com database on Nov. 3, 2021, 1 page.
English language abstract for JP 6071460 B2 extracted from espacenet.com database on Aug. 11, 2022, 2 pages.
English language abstract for JP2001050830A extracted from espacenet.com database on Aug. 1, 2019, 1 page.
English language abstract for JP2002333375A extracted from espacenet.com database on Aug. 1, 2019, 1 page.
English language abstract for JP2002340701A extracted from espacenet.com database on Aug. 1, 2019, 1 page.
English language abstract for JP2003307460A extracted from espacenet.com database on Aug. 1, 2019, 1 page.
English language abstract for JP2004053433A extracted from espacenet.com database on Aug. 1, 2019, 1 page.
English language abstract for JP2004053434A extracted from espacenet.com database on Aug. 1, 2019, 1 page.
English language abstract for JP2004053435A extracted from espacenet.com database on Aug. 1, 2019, 1 page.
English language abstract for JP2004225096A extracted from espacenet.com database on Aug. 1, 2019, 1 page.
English language abstract for JP2004264188A extracted from espacenet.com database on Aug. 1, 2019, 1 page.
English language abstract for JP2005321272A extracted from espacenet.com database on Aug. 1, 2019, 1 page.
English language abstract for JP2006010669A extracted from espacenet.com database on Aug. 1, 2019, 1 page.
English language abstract for JP2006126130A extracted from espacenet.com database on Aug. 1, 2019, 1 page.
English language abstract for JP2007101427A extracted from espacenet.com database on Aug. 1, 2019, 1 page.
English language abstract for JP2007181327A extracted from espacenet.com database on Aug. 1, 2019, 1 page.
English language abstract for JP2008026160A extracted from espacenet.com database on Aug. 1, 2019, 1 page.

Poincare, Jules Henri, "Exploring Magnetism—Session 1: Magnetism", http://cse.ssl.berkeley.edu/SegwayEd/lessons/exploring_magnetism/Exploring_Magnetism/s1.html, 2016, 6 pages.
Regents of the University of California Berkeley, "Exploring Magnetism—Session 1", http://cse.ssl.berkeley.edu/SegwayEd/lessons/exploring_magnetism/Exploring_Magnetism/s1.html, 2005, 6 pages.
English language abstract for JP2009122042A extracted from espacenet.com database on Aug. 1, 2019, 1 page.
English language abstract for JP2013053954A extracted from espacenet.com database on Aug. 1, 2019, 1 page.
English language abstract for JP2013053957A extracted from espacenet.com database on Aug. 1, 2019, 1 page.
English language abstract for JP2015009602A extracted from espacenet.com database on Aug. 1, 2019, 1 page.
English language abstract for JP2015010870A extracted from espacenet.com database on Aug. 1, 2019, 1 page.
English language abstract for JPH0116349B2 extracted from espacenet.com database on Aug. 1, 2019, 1 page.
English language abstract for JPH01187425A extracted from espacenet.com database on Aug. 1, 2019, 1 page.
English language abstract for JPH02280023A extracted from espacenet.com database on Aug. 1, 2019, 1 page.
English language abstract for JPH02280024A extracted from espacenet.com database on Aug. 1, 2019, 1 page.
English language abstract for JPH041542A extracted from espacenet.com database on Aug. 1, 2019, 1 page.
English language abstract for JPH04191630A extracted from espacenet.com database on Aug. 1, 2019, 1 page.
English language abstract for JPH05126654A extracted from espacenet.com database on Aug. 1, 2019, 1 page.
English language abstract for JPH05231966A extracted from espacenet.com database on Aug. 1, 2019, 1 page.
English language abstract for JPH05231967A extracted from espacenet.com database on Aug. 1, 2019, 1 page.
English language abstract for JPH05346360A extracted from espacenet.com database on Aug. 1, 2019, 1 page.
English language abstract for JPH0545240A extracted from espacenet.com database on Aug. 1, 2019, 1 page.
English language abstract for JPH0566164A extracted from espacenet.com database on Aug. 1, 2019, 1 page.
English language abstract for JPH06258158A extracted from espacenet.com database on Aug. 1, 2019, 1 page.
English language abstract for JPH06300647A extracted from espacenet.com database on Aug. 1, 2019, 1 page.
English language abstract for JPH06323930A extracted from espacenet.com database on Aug. 1, 2019, 1 page.
English language abstract for JPH0674844A extracted from espacenet.com database on Aug. 1, 2019, 1 page.
English language abstract for JPH07159258A extracted from espacenet.com database on Aug. 1, 2019, 1 page.
English language abstract for JPH0780756A extracted from espacenet.com database on Aug. 1, 2019, 1 page.
English language abstract for JPH08293634A extracted from espacenet.com database on Nov. 3, 2021, 2 pages.
English language abstract for JPH0843216A extracted from espacenet.com database on Aug. 1, 2019, 1 page.
English language abstract for JPH085477A extracted from espacenet.com database on Aug. 1, 2019, 1 page.
English language abstract for JPH09189624A extracted from espacenet.com database on Aug. 1, 2019, 1 page.
English language abstract for JPH0985587A extracted from espacenet.com database on Aug. 1, 2019, 1 page.
English language abstract for JPH0995247A extracted from espacenet.com database on Aug. 1, 2019, 1 page.
English language abstract for JPS6141935A extracted from espacenet.com database on Aug. 1, 2019, 1 page.
English language abstract for KR20070004377A extracted from espacenet.com database on Aug. 1, 2019, 1 page.
English language abstract for WO0118556A1 extracted from espacenet.com database on Jan. 7, 2019, 2 pages.
English language abstract for WO2004005873A1 extracted from espacenet.com database on Aug. 1, 2019, 2 pages.

(56) References Cited

OTHER PUBLICATIONS

English language abstract for WO2005029106A1 extracted from espacenet.com database on Jan. 7, 2019, 2 pages.
English language abstract for WO2005054803A1 extracted from espacenet.com database on Aug. 1, 2019, 2 pages.
English language abstract for WO2006115129A1 extracted from espacenet.com database on Nov. 3, 2021, 2 pages.
English language abstract for WO2007102465A1 extracted from espacenet.com database on Nov. 3, 2021, 2 pages.
English language abstract for WO2008017348A2 extracted from espacenet.com database on Jan. 7, 2019, 2 pages.
English language abstract for WO2012016664A2 extracted from espacenet.com database on Nov. 3, 2021, 2 pages.
English language abstract for WO2013053534A1 extracted from espacenet.com database on Jan. 7, 2019, 1 page.
English language abstract for WO2016127988A1 extracted from espacenet.com database on Nov. 3, 2021, 2 pages.
European Search Report for Application EP 16 90 2283.7 dated. Nov. 18, 2019, 2 pages.
European Search Report for Application EP 17 88 0586 dated.Jun. 23, 2020, 2 pages.
International Search Report for Application No. PCT/IB2016/052876 dated Jan. 19, 2017, 4 pages.
International Search Report for Application No. PCT/IB2017/057858 dated Mar. 29, 2018, 5 pages.
International Search Report for Application No. PCT/IB2020/051099 dated Nov. 18, 2020, 2 pages.
Microelectronic Integrated Systems (Melexis), "MLX90333—Position Sensor Data Sheet", Revision 008, Sep. 26, 2017, 48 pages.
Microelectronic Integrated Systems (Melixis), "MLX90316 Rotary Position Sensor IC Manual", Revision 10, Jul. 2013, pp. 1-45.
Microelectronic Integrated Systems (Melixis), "MLX90363 Triaxis Magnetometer IC With High Speed Serial Interface Data Sheet", Revision 005, Jul. 2013, pp. 1-57.
Moving Magnet Technologies SA (MMT), "Magnetic Field Angle Position Sensors and Rotary Sensors", http://www.movingmagnet.com/en/analog-magnetic-field-angle-measurement/, 2016, 1 page.

* cited by examiner

MAGNETOELASTIC TORQUE SENSOR WITH LOCAL MEASUREMENT OF AMBIENT MAGNETIC FIELD

CROSS-REFERENCE TO RELATED APPLICATIONS

This application is a National Stage of PCT International Application No. PCT/IB2020/051099, filed on Feb. 11, 2020, which is hereby incorporated herein by reference in its entirety.

TECHNICAL FIELD

The present disclosure relates generally to systems, sensors, and methods of measuring applied torque using magnetoelastic techniques.

BACKGROUND

Typical torque sensors have certain disadvantages. For example, the presence of an ambient magnetic field can adversely affect their accuracy. A need exists in the art for improved torque sensors that account for and reject disruptive ambient magnetic fields.

SUMMARY

A torque sensor is disclosed. The torque sensor includes a shaft that receives an applied torque. The shaft of the torque sensor includes a magnetoelastic region that generates a non-negligible magnetic field responsive to the applied torque and one or more null regions that each generates a negligible magnetic field. The torque sensor also includes a plurality of null region sensors and a magnetoelastic region sensor. Each null region sensor is proximal one of the one or more null regions and generates a null region magnetic field measure corresponding to a magnitude of an ambient magnetic field. The magnetoelastic region sensor is proximal the magnetoelastic region and generates a magnetoelastic region magnetic field measure corresponding to the magnitude of the ambient magnetic field and the non-negligible magnetic field. The torque sensor also includes a controller coupled to the plurality of null region sensors and the magnetoelastic region sensor that calculates a magnitude of the applied torque based on the null region magnetic field measures and the magnetoelastic region magnetic field measure.

A torque sensor is disclosed. The torque sensor includes a shaft that receives an applied torque. The shaft includes a first null region, a second null region, and a third null region that each generate a negligible magnetic field and a first magnetoelastic region and a second magnetoelastic region that each generate a non-negligible magnetic field responsive to the applied torque. The torque sensor also includes a first null region sensor, a second null region sensor, and a third null region sensor. The first null region sensor is proximal the first null region and generates a first null region magnetic field measure corresponding to a magnitude of an ambient magnetic field. The second null region sensor is proximal the second null region and generates a second null region magnetic field measure corresponding to the magnitude of the ambient magnetic field. The third null region sensor is proximal the third null region and generates a third null region magnetic field measure corresponding to the magnitude of the ambient magnetic field. The torque sensor also includes a first magnetoelastic region sensor and a second magnetoelastic region sensor. The first magnetoelastic region sensor is proximal the first magnetoelastic region and generates a first magnetoelastic region magnetic field measure corresponding to the magnitude of the ambient magnetic field and a magnitude of the non-negligible magnetic field generated by the first magnetoelastic region responsive to the applied torque. The second magnetoelastic region sensor is proximal the second magnetoelastic region and generates a second magnetoelastic region magnetic field measure corresponding to the magnitude of the ambient magnetic field and a magnitude of the non-negligible magnetic field generated by the second magnetoelastic region responsive to the applied torque. The torque sensor also includes a controller coupled to the first null region sensor, the second null region sensor, the third null region sensor, the first magnetoelastic region sensor, and the second magnetoelastic region sensor. The controller calculates a magnitude of the applied torque based on the first null region magnetic field measure, the second null region magnetic field measure, the third null region magnetic field measure, the first magnetoelastic region magnetic field measure, and the second magnetoelastic region magnetic field measure.

A method of calculating a magnitude of an applied torque using a torque sensor is disclosed. The torque sensor includes a shaft that includes one or more null regions that each generates a negligible magnetic field and a magnetoelastic region that generates a non-negligible magnetic field responsive to the applied torque. The torque sensor includes a plurality of null region sensors each proximal one of the one or more null regions and a magnetoelastic region sensor proximal the magnetoelastic region. The torque sensor includes a controller coupled to the plurality of null region sensors and the magnetoelastic region sensor. The method includes steps of receiving the applied torque with the shaft, generating the non-negligible magnetic field responsive to the applied torque with the magnetoelastic region, generating a null region magnetic field measure corresponding to an ambient magnetic field with each null region sensor, generating a magnetoelastic region magnetic field measure corresponding to the ambient magnetic field and the non-negligible magnetic field with the magnetoelastic region sensor, and calculating the applied torque based on the null region magnetic field measures and the magnetoelastic region magnetic field measure with the controller.

BRIEF DESCRIPTION OF THE DRAWINGS

Other advantages of the present disclosure will be readily appreciated, as the same becomes better understood by reference to the following detailed description when considered in connection with the accompanying drawings wherein.

DETAILED DESCRIPTION

Figure 1:
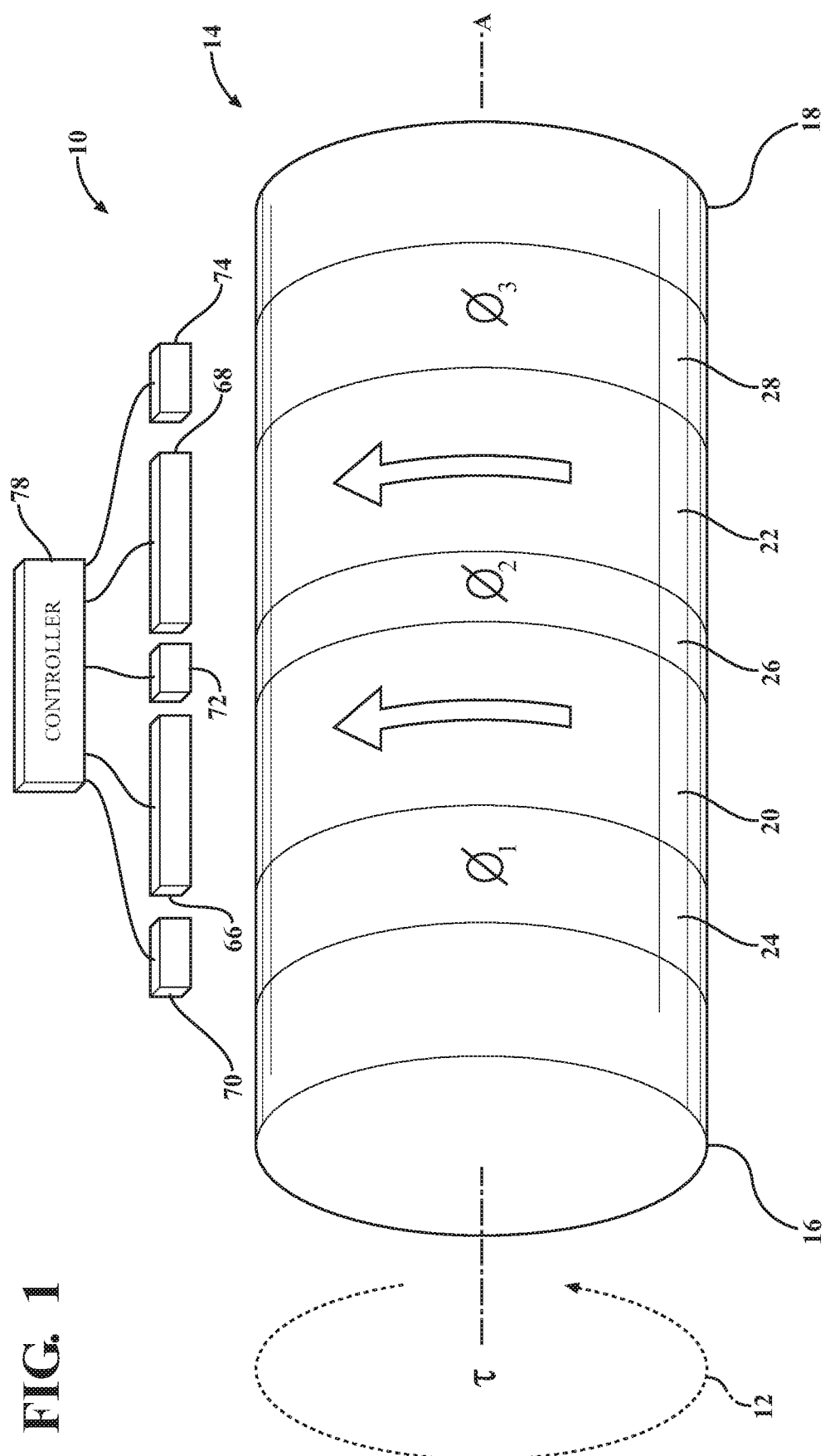
FIG. 1 provides a perspective view of a torque sensor.

FIG. 1 illustrates one instance of a torque sensor 10 that calculates a magnitude of an applied torque 12. The torque sensor 10 may be utilized in suitable applications and for any suitable component or system where the applied torque 12 is measured. For example, the torque sensor 10 may be utilized in, but not limited to, vehicular systems, such as electric power steering systems.

Referring to the instance of FIG. 1, the applied torque 12 having a magnitude τ is applied to a first end 16 of a shaft 14 of the torque sensor 10 about an axis A. However, the applied torque 12 may be applied to any section of the torque sensor 10 about the axis A. For example, the applied torque 12 may be applied to a second end 18 of the torque sensor 10 or at any point between the first and second ends 16, 18 of the torque sensor 10. Furthermore, the applied torque 12 may be applied to more than one section of the torque sensor 10. Additionally, the applied torque 12 may be applied in a clockwise or counterclockwise direction when viewed from the first end 16 of the torque sensor 10. Depending on the system that utilizes the torque sensor 10, the applied torque 12 may be applied in either or both directions.

Although the shaft 14, as shown in FIG. 1, has a cylindrical configuration, the shaft 14 may have any suitable shape defining any suitable cross-sectional area (e.g. a square, a triangle, an oval, an octagon, etc.) that enables the torque sensor 10 to properly function. Additionally, in other instances, the shaft 14 may be hollow or solid. Furthermore, in some instances, the shaft 14 may be stationary and fixed at the first and second ends 16, 18 to a larger system, which enables application of the applied torque 12 to deform the shaft 14. In other instances, the shaft 14 may rotate upon application of the applied torque 12.

As shown in FIG. 1, the shaft 14 may include a first magnetoelastic region 20 and a second magnetoelastic region 22. A region may be magnetoelastic if the region generates a magnetic field responsive to a mechanical force. For example, in the instance of FIG. 1, the first magnetoelastic region 20 and the second magnetoelastic region 22 may be magnetized to generate a magnetic field responsive to the applied torque 12 being applied to the shaft 14. In some instances, the first and second magnetoelastic regions 20, 22 may be magnetized circumferentially and may be magnetized to carry a positive or negative polarity. In FIG. 1, the first and second magnetoelastic regions 20, 22 are magnetized to have a positive polarity, as illustrated by upward pointing arrows.

As shown in FIG. 1, the shaft 14 may include a first null region 24, a second null region 26, and a third null region 28. The first, second, and third null regions 24, 26, 28 each generate a negligible magnetic field when no torque is applied to the shaft 14 and when the applied torque 12 is applied to the shaft 14. In other words, the magnetic field generated by the first, second, and third null regions 24, 26, 28 may be minimal when compared to the magnetic field generated by the first and second magnetoelastic regions 20, 22 and/or may be treated as negligible when determining the applied torque 12. As shown, the first, second, and third null regions 24, 26, 28 may carry a negligible magnetic polarization and are each illustrated in FIG. 1 using a null symbol (Ø). The first, second, and third null regions 24, 26, 28 and labelled $Ø_1$, $Ø_2$, $Ø_3$, respectively. This quality of the first, second, and third null regions 24, 26, 28 may be a manufactured, designed, or intrinsic quality.

Figure 2:
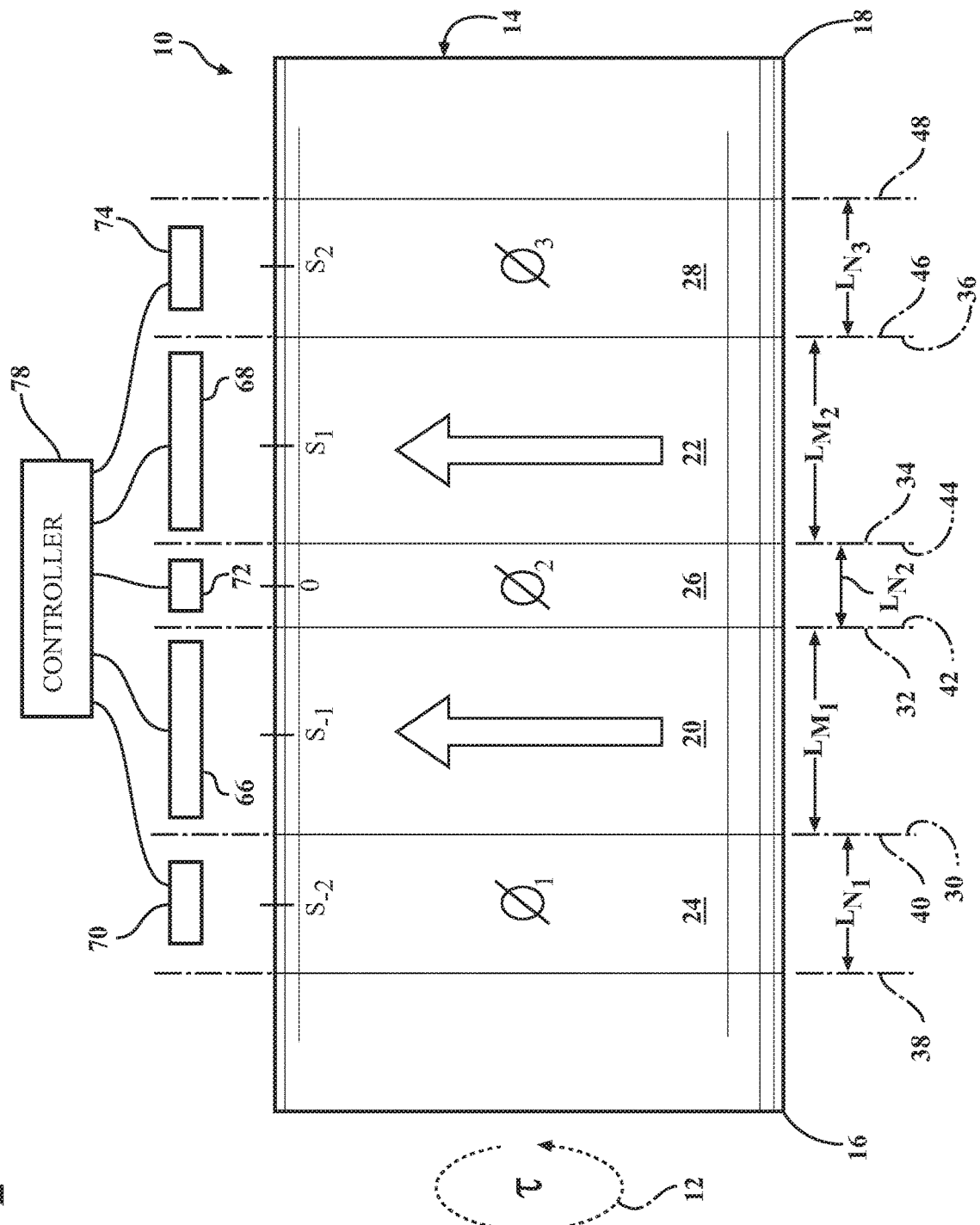
FIG. 2 provides a diagrammatic view of the torque sensor.

FIG. 2 illustrates another view of the torque sensor 10, wherein relevant locations and lengths along the shaft 14 are labeled. As shown in FIG. 2, the first magnetoelastic region 20 may be bound by a first end 30 and a second end 32. The second magnetoelastic region 22 may be bound by a first end 34 and a second end 36. The first null region 24 may be bound by a first end 38 and a second end 40, the second null region 26 may be bound by a first end 42 and a second end 44, and the third null region 28 may be bound by a first end 46 and a second end 48. In FIG. 2, the first magnetoelastic region 20 is disposed between the first null region 24 and the second null region 26 such that the first end 30 of the first magnetoelastic region 20 contacts the second end 40 of the first null region 24 and the second end 32 of the first magnetoelastic region 20 contacts the first end 42 of the second null region 26. Additionally, the second magnetoelastic region 22 is disposed between the second null region 26 and the third null region 28 such that the first end 34 of the second magnetoelastic region 22 contacts the second end 44 of the second null region 26 and the second end 36 of the second magnetoelastic region 22 contacts the first end 46 of the third null region 28. FIG. 2 also notes a length of each region 20, 22, 24, 26, 28. Specifically, $L_{M1}$ represents a length of the first magnetoelastic region 20. $L_{M2}$ represents a length of the second magnetoelastic region 22, $L_{N1}$ represents a length of the first null region 24, $L_{N2}$ represents a length of the second null region 26, and $L_{N3}$ represents a length of the third null region 28. It is to be appreciated that the ends of the regions 20, 22, 24, 26, 28 may be seamlessly integrated into the shaft 14 by virtue of magnetization and without demarcations shown in FIG. 2.

Figure 3:
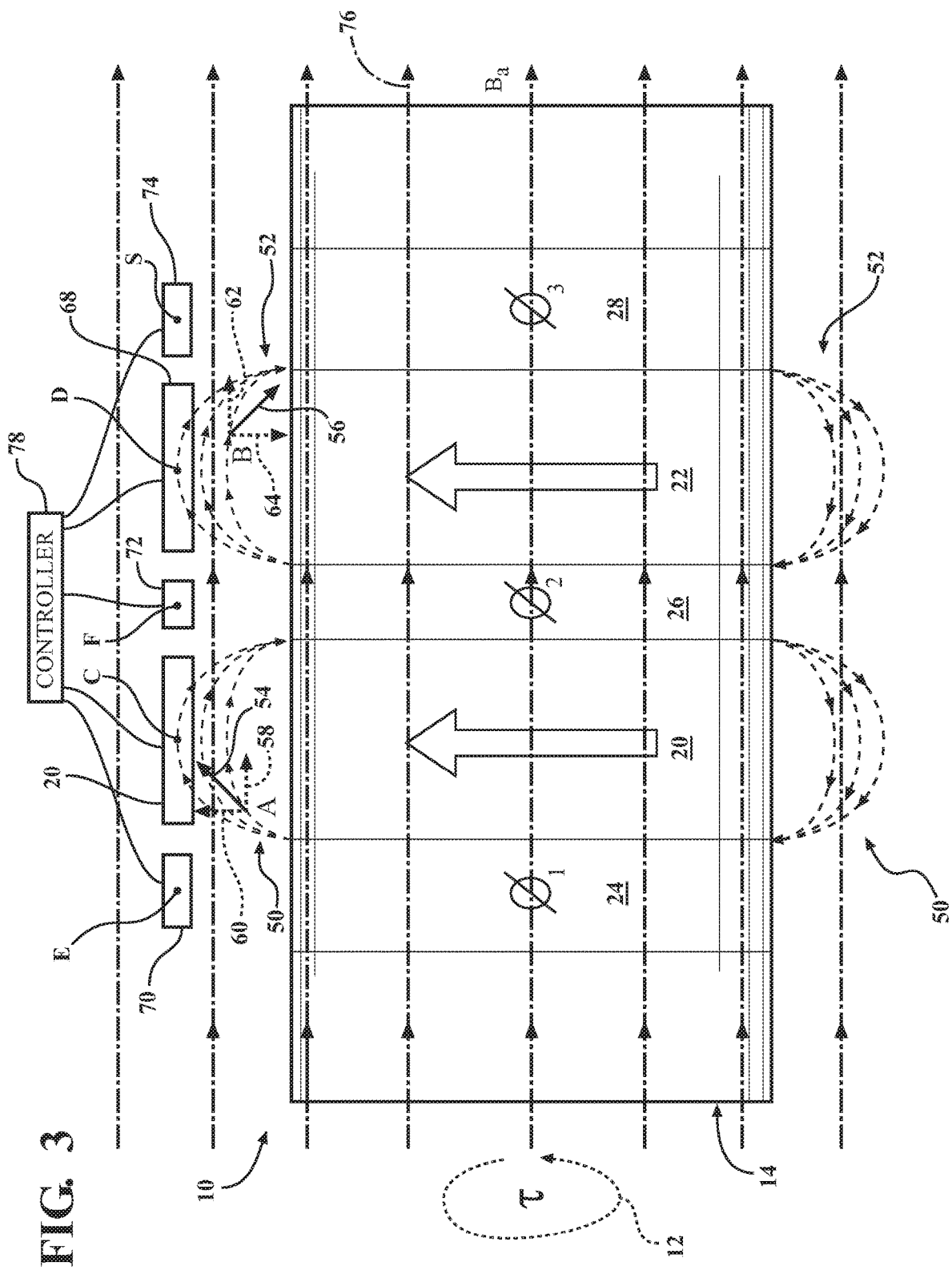
FIG. 3 provides a diagrammatic view of the torque sensor with a first ambient magnetic field superimposed.

FIG. 3 illustrates yet another view of the torque sensor 10, wherein magnetic fields generated by the first magnetoelastic region 20 and the second magnetoelastic region 22 are shown. As shown, the first magnetoelastic region 20 may generate a first non-negligible magnetic field 50 and the second magnetoelastic region 22 may generate a second non-negligible magnetic field 52. The first non-negligible magnetic field 50 and the second non-negligible magnetic field 52 will be referred to as the first magnetic field 50 and the second magnetic field 52, respectively, herein. As previously stated, the first, second, and third null regions 24, 26, 28 generate a negligible magnetic field. As such, in FIG. 3, the first, second, and third null regions 24, 26, 28 are illustrated as generating no magnetic field.

When the applied torque 12 is applied to the shaft 14, the first magnetoelastic region 20 generates the first magnetic field 50 with a magnitude corresponding to the magnitude of the applied torque 12 and the second magnetoelastic region 22 generates the second magnetic field 52 with a magnitude corresponding to the magnitude of the applied torque 12.

Figure 4:
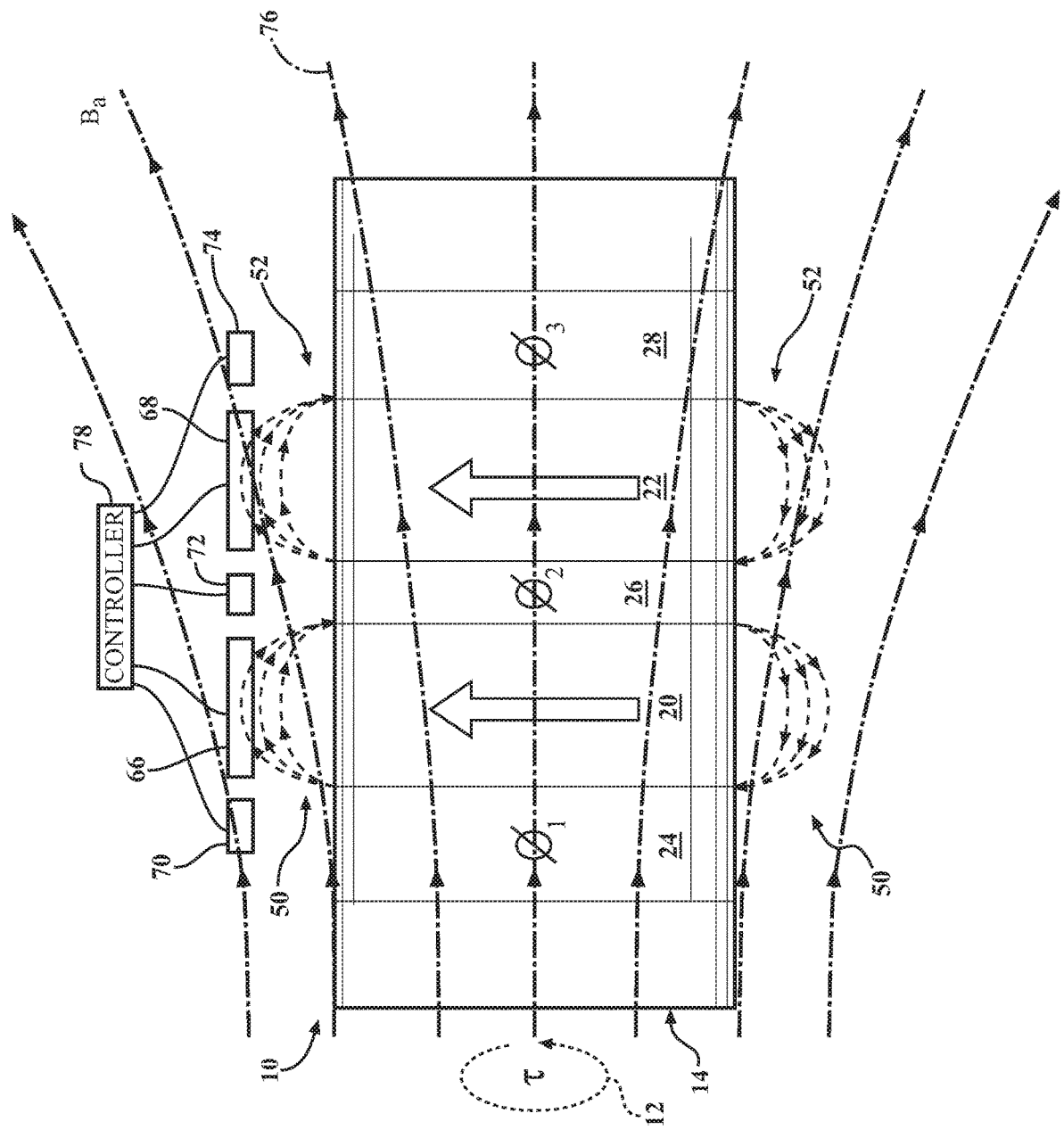
FIG. 4 provides a diagrammatic view of the torque sensor with a second ambient magnetic field superimposed.

Furthermore, the torque sensor 10 may be disposed within an ambient magnetic field 76, illustrated in FIGS. 3 and 4 using multiple dot-dashed lines and labeled $B_a$. The ambient magnetic field 76 may be a magnetic field generated by sources external to the torque sensor 10. For example, in an instance where the torque sensor 10 may be utilized by an electric power steering unit, the ambient magnetic field 76 may be a magnetic field generated by components of the electric power steering unit not including the torque sensor 10. Furthermore, the ambient magnetic field 76 may be uniform or non-uniform. For example, in FIG. 3, the ambient magnetic field 76 is a uniform ambient magnetic field. In FIG. 4, the ambient magnetic field 76 is a non-uniform ambient magnetic field. The applied torque 12 has a minimal effect on the ambient magnetic field 76 as the ambient magnetic field 76 is generated by sources external to the torque sensor 10.

It should be noted that, at a point within the ambient magnetic field 76, the first magnetic field 50, and/or the second magnetic field 52, a magnetic field vector may be used to indicate a magnitude and a direction of magnetic forces at the point. For example, in FIG. 3, the magnetic field vector 54 indicates a magnitude and a direction of a sum of the first magnetic field 50 and the ambient magnetic field 76 at point A. As another example, in FIG. 3, the magnetic field vector 56 indicates a magnitude and a direction of a sum of the second magnetic field 52 and the ambient magnetic field 76 at point B. Furthermore, the magnetic field vectors may be composed of an axial magnetic field component and an orthogonal, radial magnetic field component (the axial and radial magnetic field components are named in relation to the shaft 14). For instance, the magnetic field vector 54 in FIG. 3 is composed of an axial magnetic field component 58 and a radial magnetic field component 60. Similarly, the magnetic field vector 56 is composed of an axial magnetic field component 62 and a radial magnetic field component 64.

Referring to FIG. 1, the torque sensor 10 may also include magnetoelastic region sensors 66, 68 and null region sensors 70, 72, 74. Specifically, as shown in FIG. 1, a first magnetoelastic region sensor 66 may be disposed proximal the first magnetoelastic region 20 and a second magnetoelastic region sensor 68 may be disposed proximal the second magnetoelastic region 22. Also shown in FIG. 1, a first null region sensor 70 may be disposed proximal the first null region 24, a second null region sensor 72 may be disposed proximal the second null region 26, and a third null region sensor 74 may be disposed proximal the third null region 28.

It should be noted that the sensors 66, 68, 70, 72, 74 may be disposed proximal the regions 20, 22, 24, 26, 28 and need not be directly connected to the shaft 14. For example, in one instance, the sensors 66, 68, 70, 72, 74 may be disposed in a housing that may be adjacent to, but spaced from, the shaft 14. As such, the sensors 66, 68, 70, 72, 74 and the housing do not influence the applied torque 12 or the shaft 14 through friction.

Locations of the sensors 66, 68, 70, 72, 74 may correspond to distances along the shaft 14. In the instance of FIG. 2, the sensors 66, 68, 70, 72, 74 are disposed at marked distances $-s_2$, $-s_1$, 0, $s_1$, $s_2$ along the shaft 14. The marked distances $-s_2$, $-s_1$, 0, $s_1$, $s_2$ are marked with respect to a Cartesian plane, with a location of the second null region sensor 72 corresponding to the origin of the Cartesian plane. As such, the first magnetoelastic region sensor 66 is disposed at $-s_1$ and the second magnetoelastic region sensor 68 is disposed at $s_1$. The first, second, and third null region sensors 70, 72, 74 are disposed at $-s_2$, 0, and $s_2$, respectively.

Further, it should be noted that, while the null region sensors 70, 72, 74 are illustrated as being smaller in size than the magnetoelastic region sensors 66, 68, the sensors 66, 68, 70, 72, 74 may be any suitable size. In some instances, the null region sensors 70, 72, 74 may be a same size as the magnetoelastic region sensors 66, 68. In other instances, the null region sensors 70, 72, 74 may be a greater or smaller size than the magnetoelastic region sensors 66, 68. Additionally, a size of the sensors 66, 68, 70, 72, 74 need not correspond to a length of the regions 20, 22, 24, 26, 28 to which the sensors 66, 68, 70, 72, 74 are proximally disposed.

Referring to FIG. 3, the first magnetoelastic region sensor 66 may sense the first magnetic field 50 generated by the first magnetoelastic region 20 and the second magnetoelastic region sensor 68 may sense the second magnetic field 52 generated by the second magnetoelastic region 22. In other words, the first magnetoelastic region sensor 66 may generate a first magnetoelastic region magnetic field measure corresponding to a magnitude of the first magnetic field 50 and the second magnetoelastic region sensor 68 may generate a second magnetoelastic region magnetic field measure corresponding to a magnitude of the second magnetic field 52. The first and second magnetoelastic region magnetic field measures may correspond to a magnitude of the first and second magnetic field 50, 52, respectively. For example, in FIG. 3, the first magnetoelastic region magnetic field measure may correspond to a magnitude of the first magnetic field 50 at point C and the second magnetoelastic region magnetic field measure may correspond to a magnitude of the second magnetic field 52 at point D. In some instances, the first and second magnetoelastic region magnetic field measures may correspond to a magnitude of an axial magnetic field component or a magnitude of a radial magnetic field component of the respective magnetic field.

Also shown in FIG. 3, the first and second magnetoelastic region sensors 66, 68 may also sense a magnitude of the ambient magnetic field 76. Therefore, the first and second magnetic field measures generated by the first and second magnetoelastic region sensors 66, 68, respectively, may also correspond to the magnitude of the ambient magnetic field 76. For example, in FIG. 3, the first magnetoelastic region magnetic field measure may correspond to the magnitude of the first magnetic field 50 and a magnitude of the ambient magnetic field 76 at point C and the second magnetoelastic region magnetic field measure may correspond to the magnitude of the second magnetic field 52 and a magnitude of the ambient magnetic field 76 at point D. As such, the first magnetic field measure may correspond to a magnitude of a sum of the ambient magnetic field 76 and the first magnetic field 50 and the second magnetic field measure may correspond to a magnitude of a sum of the ambient magnetic field 76 and the second magnetic field 52. In some instances, the first and second magnetoelastic region magnetic field measures may correspond to a magnitude of an axial magnetic field component or a magnitude of a radial magnetic field component of a sum of the ambient magnetic field 76 and the respective magnetic field.

Also shown in FIG. 3, the first, second, and third null region sensors 70, 72, 74 may also sense the magnitude of the ambient magnetic field 76. In other words, the first, second, and third null region sensors 70, 72, 74 may generate a first, second, and third null region magnetic field measure, respectively, corresponding to a magnitude of the ambient magnetic field 76. The first, second, and third null region magnetic field measure may correspond to a magnitude of the ambient magnetic field 76. For example, in FIG. 3, the first null region magnetic field measure may correspond to a magnitude of the ambient magnetic field 76 at point E, the second null region magnetic field measure may correspond to a magnitude of the ambient magnetic field 76 at point F, and the third null region magnetic field measure may correspond to a magnitude of the ambient magnetic field 76 at point G. In some instances, first, second, and third null region magnetic field measures may correspond to a magnitude of an axial magnetic field component or a magnitude of a radial magnetic field component of the ambient magnetic field 76.

It should be noted that the sensors 66, 68, 70, 72, 74 each may include a plurality of sensors. For example, in one instance, the first magnetoelastic region sensor 66 may include a plurality of sensors adjacent to the first magnetoelastic region 20 to generate the first magnetoelastic region magnetic field measure. In such an instance, the plurality of sensors may each generate a measure of the first magnetic field 50 and the ambient magnetic field 76 and the sensor 66 may average or filter the measures generated by each sensor of the plurality of sensors to generate the first magnetoelastic region magnetic field measure.

It should also be noted that the sensors 66, 68, 70, 72, 74 may be any sensor suitable for sensing a magnetic field. For example, the sensors 66, 68, 70, 72, 74 may include at least one of a Hall effect sensor, a giant magnetoresistance magnetometer, an AMR magnetometer, a magneto-optical sensor, a search coil magnetic field sensor, a magnetodiode, a fluxgate magnetometer, or any other sensor suitable to sense a magnetic field.

As shown in FIG. 1, the sensors 66, 68, 70, 72, 74 may be coupled to a controller 78, which may calculate the magnitude of the applied torque 12 based on measures generated by the sensors 66, 68, 70, 72, 74. In some instances, the controller 78 and the torque sensor 10 may be separate components of a vehicular subsystem for determining the magnitude of the applied torque 12. In one such instance, the vehicular subsystem may be an electric power steering unit of a vehicle. Furthermore, it should be noted that the controller 78 may include any suitable logic, signal processing means, or components for enabling performance of the described functions. Additionally, it should be noted that, in other instances, the sensors 66, 68, 70, 72, 74 may be similarly configured to measure other forces applied to the shaft 14, such as stress and strain, and the controller 78 may be configured to determine a magnitude of such other forces.

Figure 5A:
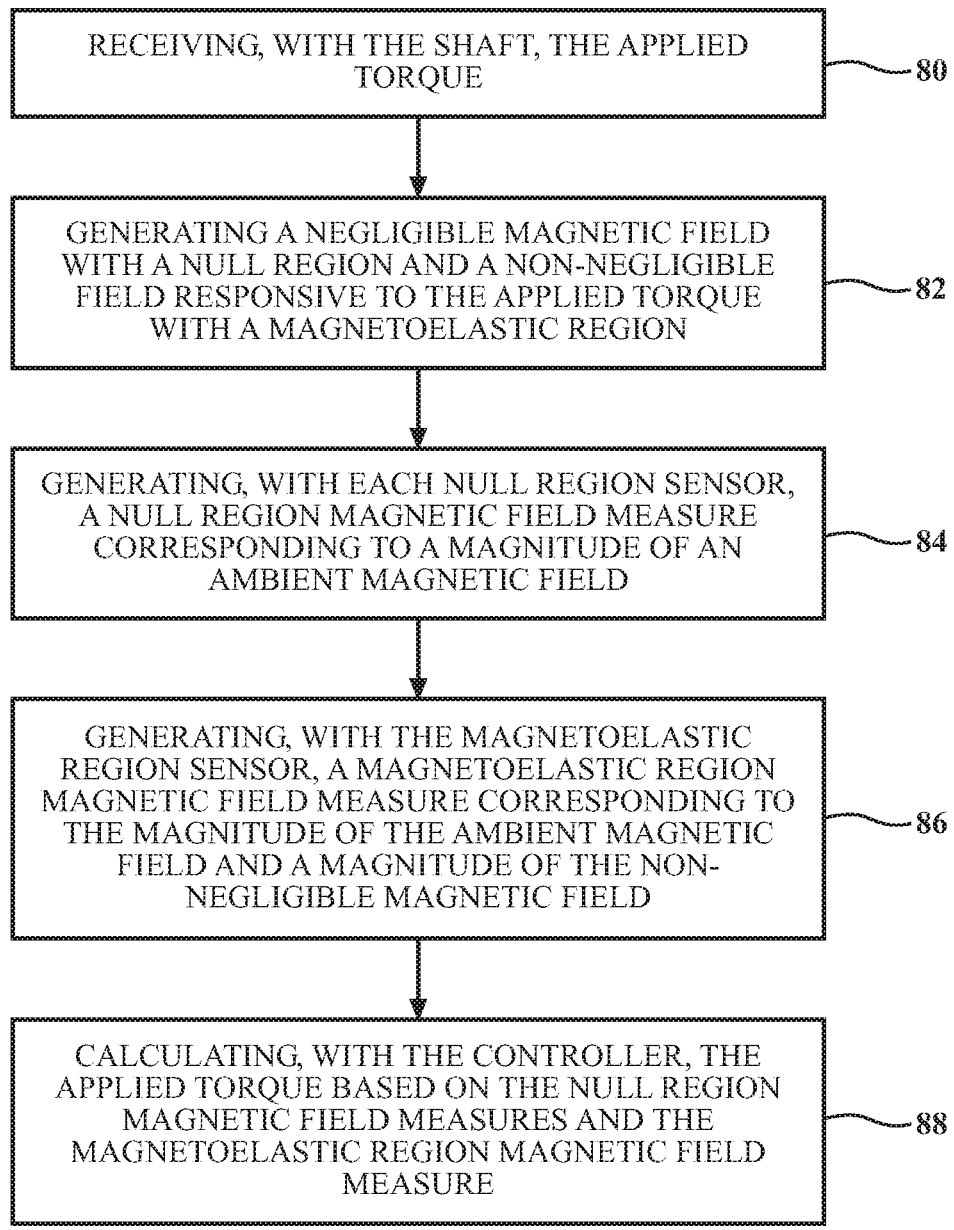
FIGS. 5A and 5B provide a flow chart of a method of calculating a magnitude of an applied torque using a torque sensor.

FIG. 5A illustrates one instance of a method of calculating the magnitude of the applied torque 12. The method includes a step 80 of receiving the applied torque 12 with the shaft 14 of the torque sensor 10; a step 82 of generating a non-negligible magnetic field responsive to the applied torque 12 (e.g. the first or second magnetic field 50, 52) with a magnetoelastic region (e.g. the first or second magnetoelastic region 20, 22); a step 84 of generating a null region magnetic field measure corresponding to the magnitude of the ambient magnetic field 76 with each null region sensor (e.g. the first, second, and third null region sensors 70, 72, 74); a step 86 of generating a magnetoelastic region magnetic field measure corresponding to the magnitude of the ambient magnetic field 76 and the non-negligible magnetic field with a magnetoelastic region sensor (e.g. the first or second magnetoelastic region sensor 66, 68); and a step 88 of calculating the applied torque 12 based on the null region magnetic field measures and the magnetoelastic region magnetic field measure with the controller 78.

Figure 5B:
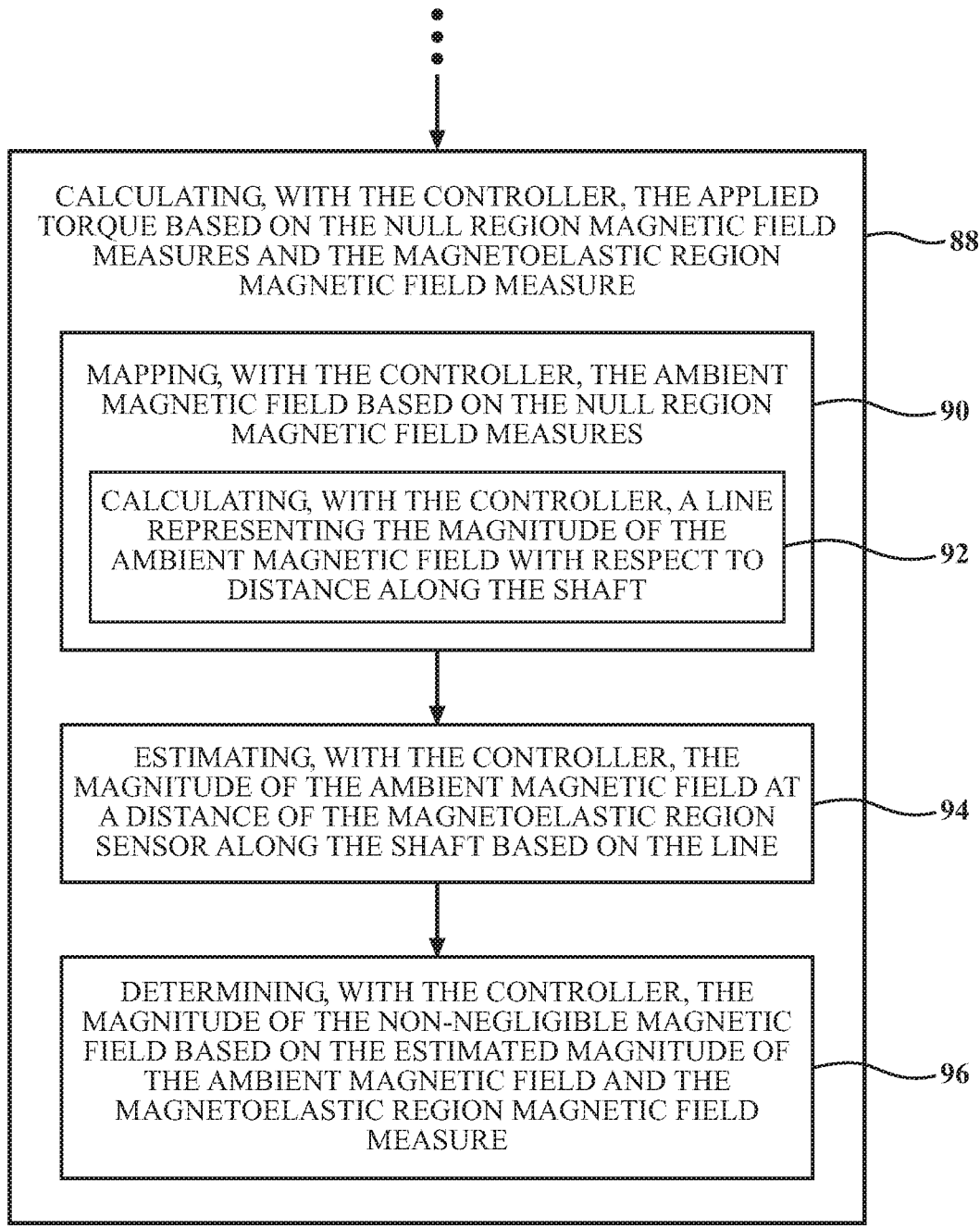

FIG. 5B further illustrates one instance of the step 88 of calculating the applied torque 12 with the controller 78. As shown, step 88 may include a step 90 of mapping the ambient magnetic field 76 based on the null region magnetic field measures, which may include a step 92 of calculating a line representing the magnitude of the ambient magnetic field with respect to distance along the shaft 14. Further, step 88 may include a step 94 of estimating the magnitude of the ambient magnetic field 76 at a distance of the magnetoelastic region sensor along the shaft 14 based on the line.

Figure 6A:
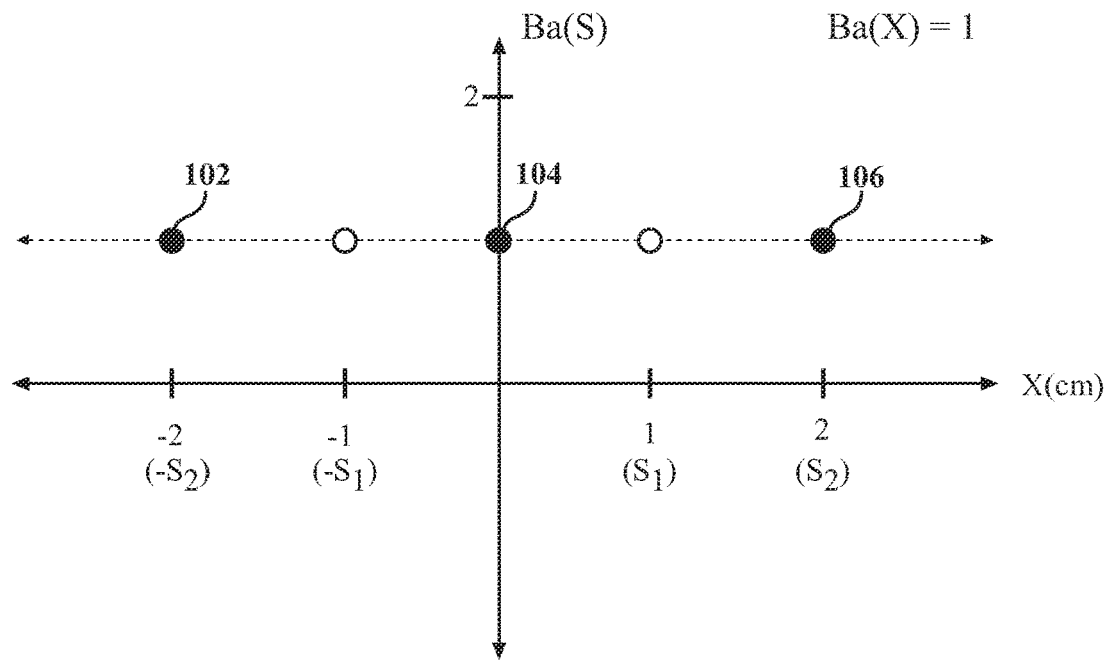
FIG. 6A provides a graph of a magnitude of the first ambient magnetic field with respect to distance along a shaft of the torque sensor.
Figure 6B:
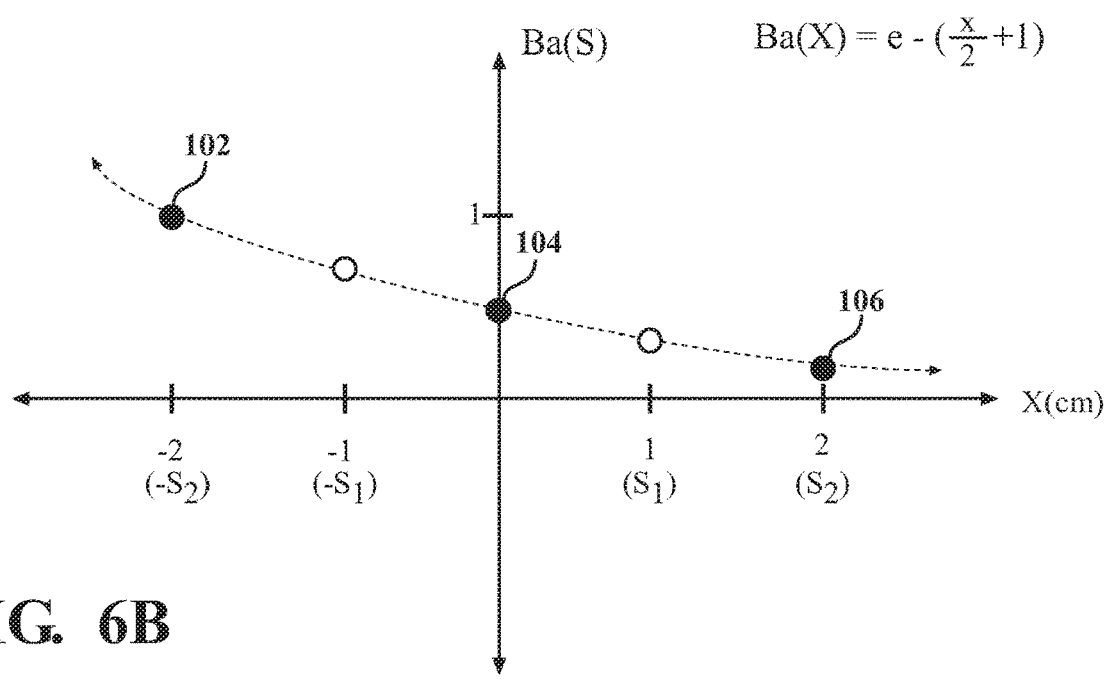
FIG. 6B provides a graph of a magnitude of the second ambient magnetic field with respect to distance along the shaft of the torque sensor.

FIGS. 6A and 6B illustrate examples of step 90, 92, and 94 of step 88. In the instances of FIGS. 6A and 6B the controller 78 maps first, second, and third null region magnetic field measures 102, 104, 106 generated by the first, second, and third null region sensors 70, 72, 74, respectively. The first, second, and third null region magnetic field measures 102, 104, 106 are mapped according to the distance of the first, second, and third null region sensors 70, 72, 74 (i.e. $-s_2$, 0, and $s_2$, respectively) along the shaft 14 using closed circles "•". In the instance of FIGS. 6A and 6B, $-s_2=-2$ cm, and $s_2=2$ cm. As previously stated, the null region magnetic field measures correspond to the magnitude of the ambient magnetic field 76. As such, the controller 78 maps the ambient magnetic field 76 by mapping the first, second, and third null region magnetic field measures 102, 104, 106. Further, the controller 78 calculates a line representing the magnitude of the ambient magnetic field 76 with respect to distance along the shaft 14. The controller 78 may then estimate the magnitude of the ambient magnetic field 76 at the distance of the magnetoelastic region sensor. In the instance of FIGS. 6A and 6B, the controller 78 estimates the magnitude of the ambient magnetic field 76 at $-s_1=-1$ cm and $s_1=1$ cm, the location of the first and second magnetoelastic region sensors 66, 68, respectively. The estimated magnitude of the ambient magnetic field 76 are represented using open circles "○".

FIG. 6A corresponds to the torque sensor 10 of FIG. 3, which is disposed in the uniform ambient magnetic field 76. As shown in FIG. 6A, the first, second, and third null region magnetic field measures 102, 104, 106 equal 1 Gauss (G) and correspond to the magnitude of the uniform ambient magnetic field 76. As such, the controller 78 calculates a line using a constant function to represent the magnitude of the uniform ambient magnetic field with respect to distance along the shaft 14:

$$B_a(x)=1.$$

The controller 78 may estimate the magnitude of the ambient magnetic field 76 at $-s_1=-1$ cm and $s_1=1$ cm to be 1 G.

FIG. 6B corresponds to the torque sensor 10 of FIG. 4, which is disposed in the non-uniform ambient magnetic field 76. As shown in FIG. 6B, the first, second, and third null region magnetic field measures 102, 104, 106 equal 1 G, 0.37 G, and 0.14 G, respectively, and correspond to the magnitude of the non-uniform ambient magnetic field 76. As such, the controller 78 calculates a line using an exponential function to represent the magnitude of the non-uniform ambient magnetic field with respect to distance along the shaft 14:

$$B_a(x)=e^{-(0.5x+1)}.$$

The controller 78 may estimate the magnitude of the ambient magnetic field 76 at $-s_1=-1$ cm and $s_1=1$ cm to be 0.61 G and 0.22 G, respectively.

In other instances, the controller 78 may estimate the magnitude of the ambient magnetic field 76 with respect to distance along the shaft 14 using a linear function, a power function, a root function, a polynomial function, a sinusoidal function, a rational function, and/or a logarithmic function. For example, a linear function may be represented as:

$$B_a(x)=Ax+B$$

The controller 78 may select values for "A" and "B" such that $B_a(-s_2)$, $B_a(0)$, and $B_a(s_2)$ correspond to the null region magnetic field measures. As another example, a polynomial function may be represented as:

$$B_a(x)=A_1+A_2x+A_3x^2+\ldots+A_nx^{n-1}.$$

The controller 78 may select a value for "n" based on desired precision of $B_a(x)$. For instance, for more precise calculations of $B_a(x)$, the controller 78 may select a greater value of n for a greater the number of exponentials in $B_a(x)$. Furthermore, the controller 78 may select values for "$A_1$", "$A_2$", etc., such that such that $B_a(-s_2)$, $B_a(0)$, and $B_a(s_2)$ correspond to the null region magnetic field measures. In some instances the controller 78 may calculate $B_a(x)$ such that such that $B_a(-s_2)$, $B_a(0)$, and $B_a(s_2)$ are within an adjustable or programmed tolerance of the null region magnetic field measures.

Also shown in FIG. 5B, step 88 may include a step 96 of determining the magnitude of the non-negligible magnetic field (e.g. the first magnetic field 50 and/or the second magnetic field 52) based on the estimated magnitude of the ambient magnetic field 76 and the magnetoelastic region magnetic field measure. As previously stated, the magnetoelastic region magnetic field measure corresponds to the magnitude of the ambient magnetic field 76 and the non-negligible magnetic field. For example, the magnetoelastic region magnetic field measure generated by the first magnetoelastic region sensor 66 corresponds to the magnitude of the ambient magnetic field 76 and the first magnetic field 50. As such, the controller 78 may determine the magnitude of the first magnetic field 50 by subtracting the estimated magnitude of the ambient magnetic field 76 from the magnetoelastic region magnetic field measure.

In the example of FIG. 6B, the controller 78 may determine the magnitude of the first magnetic field 50 by subtracting the estimated magnitude of the ambient magnetic field 76 at the location of the first magnetoelastic region sensor 66, $B_a(-s_1)$, which is estimated to be 0.61 G, from the magnetoelastic region magnetic field measure generated by the first magnetoelastic region sensor 66. Similarly, the controller 78 may determine the magnitude of the second magnetic field 52 by subtracting the estimated magnitude of the ambient magnetic field 76 at the location of the second magnetoelastic region sensor 68, $B_a(s_1)$, which is estimated to be 0.22 G, from the magnetoelastic region magnetic field measure generated by the second magnetoelastic region sensor 68.

Since the magnitude of applied torque 12 corresponds to a magnetic field generated by a magnetoelastic region of the shaft 14, the controller 78 may determine the magnitude of the applied torque 12 after determining the magnitude of the magnetic field. In some instances, the controller 78 may use a lookup table to determine the magnitude of the applied torque 12 based on the magnitude of the magnetic field. In instances where the torque sensor 10 includes multiple magnetoelastic regions, such as the instance of FIG. 1, the controller 78 may average the magnitudes of the magnetic fields generated by the magnetoelastic regions of the shaft 14 and use a lookup table to determine the magnitude of the applied torque 12.

Advantageously, by calculating the applied torque 12 based on the null region magnetic field measures and the magnetoelastic region magnetic field measure, the torque sensor 10 is able to reject the ambient magnetic field 76. Further, by mapping the ambient magnetic field 76 using constant, linear, exponential, logarithmic, polynomic, sinusoidal, and a variety of other functions, the torque sensor 10 is able to approximate and reject uniform and non-uniform ambient magnetic fields.

Figure 7A:
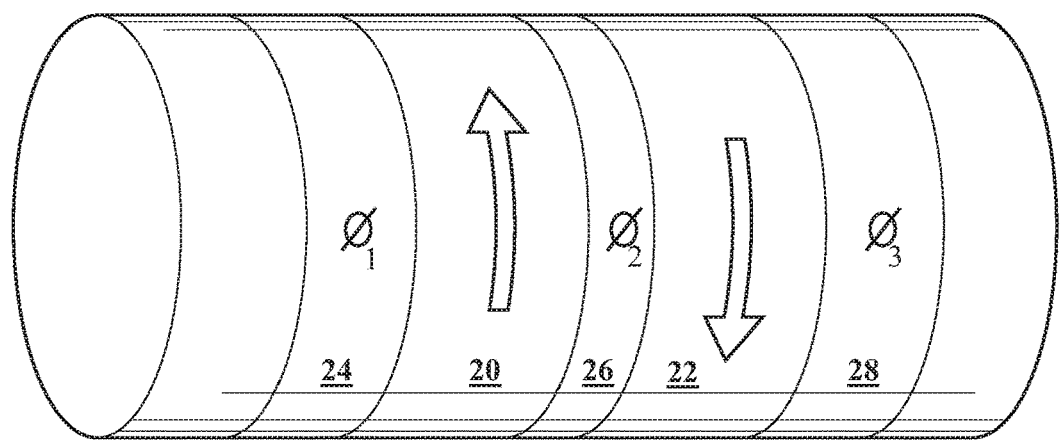
FIGS. 7A-7F provide alternative instances of the torque sensor.

In other instances, the torque sensor 10 may vary. For instance, the magnetoelastic regions of the torque sensor 10 may be magnetized to have different polarities. As an example, in FIG. 7A, the first magnetoelastic region 20 and the second magnetoelastic region 22 of the torque sensor 10 have opposing polarities.

Figure 7B:
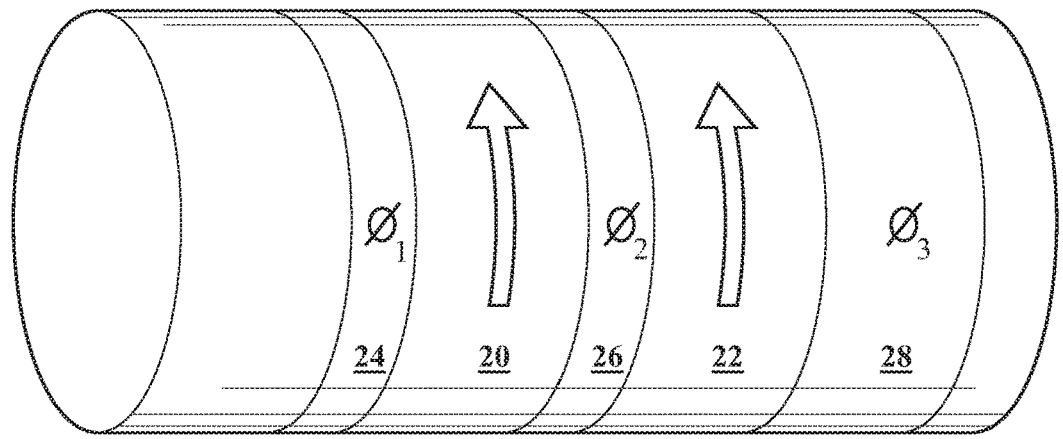

In some instances, lengths of the null regions and the magnetoelastic regions may vary. For example, in FIG. 7B, the second null region 26 and the third null region 28 have a greater length than the second null region 26 and the third null region 28 in FIG. 1. Additionally, the second magnetoelastic region 22 in FIG. 7B has a smaller length than the second magnetoelastic region 22 in FIG. 1.

Figure 7C:
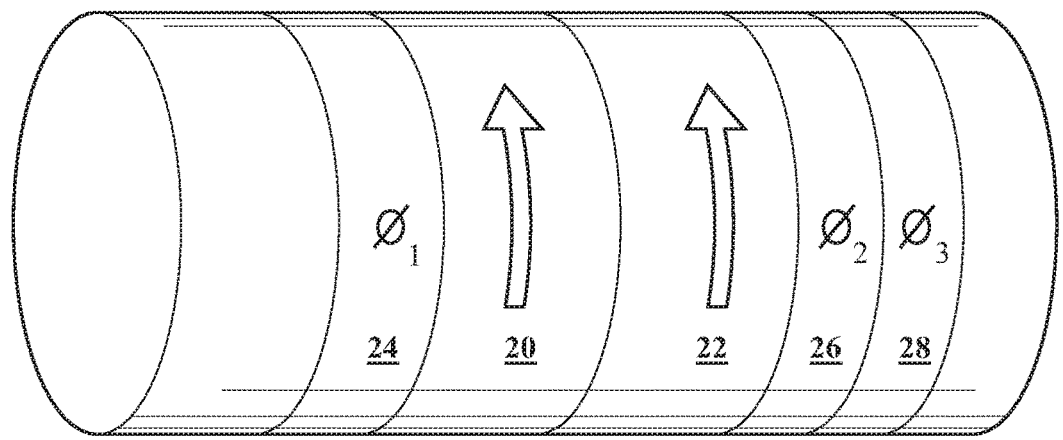

In some instances, the null regions and the magnetoelastic regions may be ordered along the shaft in any suitable fashion. For example, in FIG. 7C, the second null region 26 is disposed between the second magnetoelastic region 22 and the third null region 28.

Figure 7D:
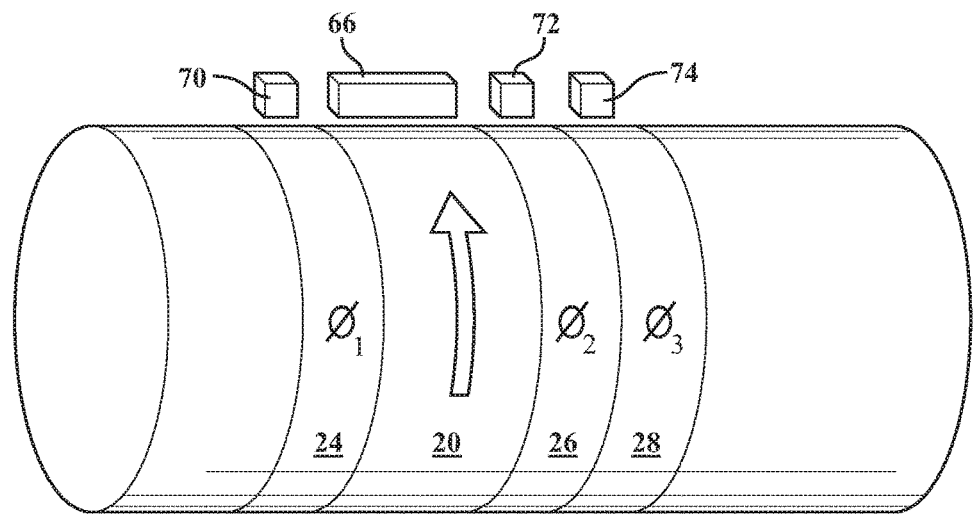
Figure 7E:
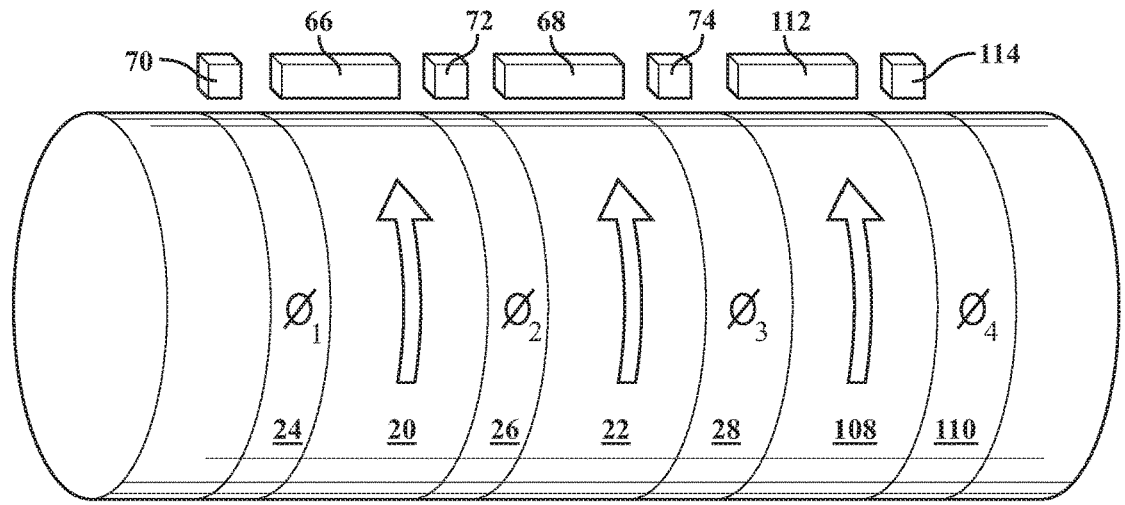

In some instances, the torque sensor 10 may include any suitable number of magnetoelastic regions and null regions, and a corresponding number magnetoelastic region sensors and null region sensors. For example, in FIG. 7D, the torque sensor 10 includes one magnetoelastic region, the first magnetoelastic region 20, and one magnetoelastic region sensor, the first magnetoelastic region sensor 66. In FIG. 7E, the torque sensor 10 includes three magnetoelastic regions 20, 22, 108, three corresponding magnetoelastic regions sensors 66, 68, 112, four null regions 24, 26, 28, 110, and four corresponding null region sensors 70, 72, 74, 114.

Figure 7F:
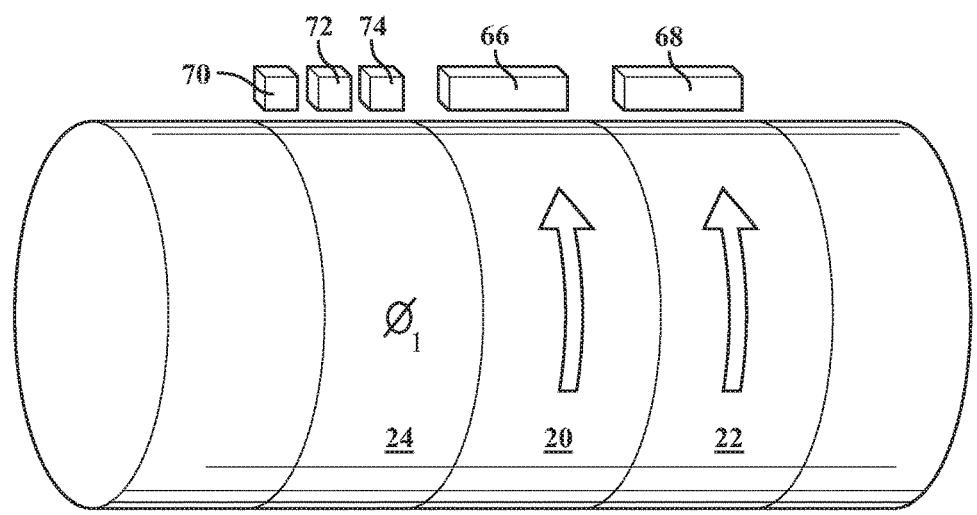

In some instances, such as the instance of FIG. 7F, the torque sensor 10 may include fewer than three null regions. It has been contemplated that the torque sensor 10 may include one or more null regions and may therefore include fewer than three null regions. In such instances, while the torque sensor 10 includes fewer than three null regions, the torque sensor 10 may still include three or more null region sensors such that the controller 78 may calculate the line representing the magnitude of the ambient magnetic field with respect to distance along the shaft 14 using three null region magnetic field measures. For example, in FIG. 7F, the torque sensor 10 only includes the first null region 24, but the first, second, and third null region sensors 70, 72, 74 are disposed along the first null region 24 and generate a first, second, and third null region magnetic field measure. Generally, one or more null region sensors may be disposed proximal any null region.

It should be noted that, in the instances of the torque sensor 10 illustrated herein, the torque sensor 10 includes three or more null region sensors. It has been contemplated that the torque sensor 10 may include a fewer number of null region sensors. For example, in instances where the torque sensor 10 includes one null region sensor that generates a null region magnetic field measure, the controller 78 may calculate the line representing the magnitude of the ambient magnetic field with respect to distance along the shaft 14 by assuming a constant ambient magnetic field 76. As another example, in instances where the torque sensor 10 includes two null region sensors that generate (in total) two null region magnetic field measures, the controller 78 may calculate the line representing the magnitude of the ambient magnetic field with respect to distance along the shaft 14 by assuming a linear ambient magnetic field 76.

Several instances have been discussed in the foregoing description. However, the instances discussed herein are not intended to be exhaustive or limit the invention to any particular form. The terminology which has been used is intended to be in the nature of words of description rather than of limitation. Many modifications and variations are possible in light of the above teachings and the invention may be practiced otherwise than as specifically described.

The invention claimed is:

1. A torque sensor comprising:
   a shaft that receives an applied torque, the shaft comprising a magnetoelastic region that generates a non-negligible magnetic field responsive to the applied torque and one or more null regions that each generates a negligible magnetic field;

a plurality of null region sensors, each null region sensor proximal one of the one or more null regions and generating a null region magnetic field measure corresponding to a magnitude of an ambient magnetic field;

a magnetoelastic region sensor proximal the magnetoelastic region and generating a magnetoelastic region magnetic field measure corresponding to the magnitude of the ambient magnetic field and a magnitude of the non-negligible magnetic field; and a controller coupled to the plurality of null region sensors and the magnetoelastic region sensor that calculates a magnitude of the applied torque based on the null region magnetic field measures and the magnetoelastic region magnetic field measure;

the shaft receiving the applied torque such that the magnetoelastic region generates the non-negligible magnetic field responsive to the applied torque, and wherein the controller calculates the magnitude of the applied torque by mapping the ambient magnetic field based on the null region magnetic field measures;

each null region sensor being disposed at a distance along the shaft;

the null region magnetic field measure generated by each null region sensor comprising a measure of the magnitude of the ambient magnetic field at the distance of the null region sensor along the shaft; and the controller mapping the ambient magnetic field based on the null region magnetic field measures by calculating a line representing the magnitude of the ambient magnetic field with respect to distance along the shaft based on the null region magnetic field measures.

2. The torque sensor of claim 1, wherein the line representing the magnitude of the ambient magnetic field with respect to distance along the shaft includes at least one of a constant function, a linear function, an exponential function, a power function, a root function, a polynomial function, a sinusoidal function, a rational function, or a logarithmic function.

3. The torque sensor of claim 1, wherein:
the magnetoelastic region sensor is disposed at a distance along the shaft;
the magnetoelastic region magnetic field measure generated by the magnetoelastic region sensor is based on the magnitude of the ambient magnetic field at the distance of the magnetoelastic region sensor along the shaft and the magnitude of the non-negligible magnetic field; and
the controller calculates the magnitude of the applied torque by:
estimating, based on the line representing the magnitude of the ambient magnetic field with respect to distance along the shaft, the magnitude of the ambient magnetic field at the distance of the magnetoelastic region sensor along the shaft;
determining the magnitude of the non-negligible magnetic field based on the estimated magnitude of the ambient magnetic field and the magnetoelastic region magnetic field measure; and
determining the magnitude of the applied torque based on the magnitude of the non-negligible magnetic field.

4. The torque sensor of claim 1, wherein the one or more null regions comprises a first null region, a second null region, and a third null region.

5. A torque sensor comprising:
a shaft that receives an applied torque, the shaft comprising a magnetoelastic region that generates a non-negligible magnetic field responsive to the applied torque and one or more null regions that each generates a negligible magnetic field;

a plurality of null region sensors, each null region sensor proximal one of the one or more null regions and generating a null region magnetic field measure corresponding to a magnitude of an ambient magnetic field;

a magnetoelastic region sensor proximal the magnetoelastic region and generating a magnetoelastic region magnetic field measure corresponding to the magnitude of the ambient magnetic field and a magnitude of the non-negligible magnetic field; and a controller coupled to the plurality of null region sensors and the magnetoelastic region sensor that calculates a magnitude of the applied torque based on the null region magnetic field measures and the magnetoelastic region magnetic field measure;

the one or more null regions comprising a first null region, a second null region, and a third null region;

the plurality of null region sensors comprising:
a first null region sensor disposed at a first distance along the shaft and proximal the first null region, the first null region generating a first null region magnetic field measure comprising a measure of the magnitude of the ambient magnetic field at the first distance;
a second null region sensor disposed at a second distance along the shaft and proximal the second null region, the second null region sensor generating a second null region magnetic field measure comprising a measure of the magnitude of the ambient magnetic field at the second distance; and
a third null region sensor disposed at a third distance along the shaft and proximal the third null region, the third null region sensor generating a third null region magnetic field measure comprising a measure of the magnitude of the ambient magnetic field at the third distance; and
the controller calculating the magnitude of the applied torque by mapping the ambient magnetic field based on the first null region magnetic field measure, the second null region magnetic field measure, and the third null region magnetic field measure by calculating a line representing the magnitude of the ambient magnetic field with respect to distance along the shaft based on the first null region magnetic field measure, the second null region magnetic field measure, and the third null region magnetic field measure.

6. The torque sensor of claim 1, wherein:
the shaft further comprises a second magnetoelastic region;
the torque sensor further comprises a second magnetoelastic region sensor proximal the second magnetoelastic region that generates a second magnetoelastic region magnetic field measure; and
the controller is coupled to magnetoelastic region sensor and the second magnetoelastic region sensor and calculates the magnitude of the applied torque based on the null region magnetic field measures, the magnetoelastic region magnetic field measure, and the second magnetoelastic region magnetic field measure.

7. The torque sensor of claim 1, wherein the one or more null regions comprises a first null region, a second null region, and a third null region and the shaft comprises a second magnetoelastic region.

8. The torque sensor of claim 7, wherein the shaft comprises a first end and an opposing second end and an axis defined between the first and second ends.

9. The torque sensor of claim 8, wherein the applied torque is applied to the shaft of the torque sensor about the axis.

10. The torque sensor of claim 8, wherein the first null region, the second null region, the third null region, the magnetoelastic region, and the second magnetoelastic region each comprises a first end and an opposing second end defining a length along the axis.

11. The torque sensor of claim 10, wherein the magnetoelastic region is disposed between the first null region and the second null region such that the first end of the magnetoelastic region contacts the second end of the first null region and the second end of the magnetoelastic region contacts the first end of the second null region; and wherein the second magnetoelastic region is disposed between the second null region and the third null region such that the first end of the second magnetoelastic region contacts the second end of the second null region and the second end of the second magnetoelastic region contacts the first end of the third null region.

12. The torque sensor of claim 1, wherein the plurality of null region sensors and the magnetoelastic region sensor are disposed on a housing spaced from and adjacent to the shaft.

13. The torque sensor of claim 1, wherein the plurality of null region sensors and the magnetoelastic region sensor each comprises at least one of a Hall effect sensor, a giant magnetoresistance magnetometer, an AMR magnetometer, a magneto-optical sensor, a search coil magnetic field sensor, a magnetodiode, or a fluxgate magnetometer.

14. A torque sensor comprising:

a shaft that receives an applied torque, the shaft comprising:

a first null region, a second null region, and a third null region that each generates a negligible magnetic field; and a first magnetoelastic region and a second magnetoelastic region that each generates a non-negligible magnetic field responsive to the applied torque;

a first null region sensor proximal the first null region and generating a first null region magnetic field measure corresponding to a magnitude of an ambient magnetic field;

a second null region sensor proximal the second null region and generating a second null region magnetic field measure corresponding to the magnitude of the ambient magnetic field;

a third null region sensor proximal the third null region and generating a third null region magnetic field measure corresponding to the magnitude of the ambient magnetic field;

a first magnetoelastic region sensor proximal the first magnetoelastic region and generating a first magnetoelastic region magnetic field measure corresponding to the magnitude of the ambient magnetic field and a magnitude of the non-negligible magnetic field generated by the first magnetoelastic region responsive to the applied torque;

a second magnetoelastic region sensor proximal the second magnetoelastic region and generating a second magnetoelastic region magnetic field measure corresponding to the magnitude of the ambient magnetic field and a magnitude of the non-negligible magnetic field generated by the second magnetoelastic region responsive to the applied torque; and a controller coupled to the first null region sensor, the second null region sensor, the third null region sensor, the first magnetoelastic region sensor, and the second magnetoelastic region sensor that calculates a magnitude of the applied torque based on the first null region magnetic field measure, the second null region magnetic field measure, the third null region magnetic field measure, the first magnetoelastic region magnetic field measure, and the second magnetoelastic region magnetic field measure.

\* \* \* \* \*

UNITED STATES PATENT AND TRADEMARK OFFICE
CERTIFICATE OF CORRECTION

| | |
|---|---|
| PATENT NO. | : 12,281,951 B2 |
| APPLICATION NO. | : 17/929022 |
| DATED | : April 22, 2025 |
| INVENTOR(S) | : Jean-Francois Veillette and Serge Kaldany |

Page 1 of 1

It is certified that error appears in the above-identified patent and that said Letters Patent is hereby corrected as shown below:

On the Title Page

Page 3, Column 1, Lines 35, 46 and 56, under item (56):

Cited references - FOREIGN PATENT DOCUMENTS section; "IN 105277303 A 1/2016" should read --CN 105277303 A 1/2016--

Cited references - FOREIGN PATENT DOCUMENTS section; "JP 10543040 U 6/1993" should read --JP H0543040 U 6/1993--

Cited references - FOREIGN PATENT DOCUMENTS section; "JP 106047832 U 6/1994" should read --JP H06047832 U 6/1994--

Signed and Sealed this
Third Day of June, 2025

Coke Morgan Stewart
*Acting Director of the United States Patent and Trademark Office*